(12) United States Patent
Bhatia et al.

(10) Patent No.: US 8,664,127 B2
(45) Date of Patent: Mar. 4, 2014

(54) TWO SILICON-CONTAINING PRECURSORS FOR GAPFILL ENHANCING DIELECTRIC LINER

(75) Inventors: Sidharth Bhatia, Menlo Park, CA (US); Hiroshi Hamana, Hyogo (JP); Paul Edward Gee, San Jose, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 300 days.

(21) Appl. No.: 13/182,671

(22) Filed: Jul. 14, 2011

(65) Prior Publication Data

US 2012/0094468 A1 Apr. 19, 2012

Related U.S. Application Data

(60) Provisional application No. 61/393,604, filed on Oct. 15, 2010.

(51) Int. Cl.
*H01L 21/00* (2006.01)

(52) U.S. Cl.
USPC .......................................... 438/786; 438/789

(58) Field of Classification Search
USPC ................................................ 438/786–790
See application file for complete search history.

(56) References Cited

U.S. PATENT DOCUMENTS

| 4,147,571 A | 4/1979 | Stringfellow et al. |
|---|---|---|
| 4,200,666 A | 4/1980 | Reinberg |
| 4,816,098 A | 3/1989 | Davis et al. |
| 4,818,326 A | 4/1989 | Liu et al. |
| 4,910,043 A | 3/1990 | Freeman et al. |
| 4,931,354 A | 6/1990 | Wakino et al. |
| 4,946,593 A | 8/1990 | Pinigis |
| 5,016,332 A | 5/1991 | Reichelderfer et al. |

(Continued)

FOREIGN PATENT DOCUMENTS

| DE | 19654737 A1 | 7/1997 |
|---|---|---|
| EP | 0892083 A1 | 1/1999 |

(Continued)

OTHER PUBLICATIONS

Franz, et al., "Conversion of silicon nitride into silicon dioxide through the influence of oxygen," Solid-State Electronics, Jun. 1971, pp. 449-505, vol. 14, Issue 6, Germany. Abstract Only.

(Continued)

*Primary Examiner* — Richard Booth
(74) *Attorney, Agent, or Firm* — Kilpatrick Townsend & Stockton LLP (57) ABSTRACT

Aspects of the disclosure pertain to methods of depositing silicon oxide layers on substrates. In embodiments, silicon oxide layers are deposited by flowing a silicon-containing precursor having a Si—O bond, an oxygen-containing precursor and a second silicon-containing precursor, having both a Si—C bond and a Si—N bond, into a semiconductor processing chamber to form a conformal liner layer. Upon completion of the liner layer, a gap fill layer is formed by flowing a silicon-containing precursor having a Si—O bond, an oxygen-containing precursor into the semiconductor processing chamber. The presence of the conformal liner layer improves the ability of the gap fill layer to grow more smoothly, fill trenches and produce a reduced quantity and/or size of voids within the silicon oxide filler material.

19 Claims, 6 Drawing Sheets

(56) References Cited

U.S. PATENT DOCUMENTS

| | | |
|---|---|---|
| 5,110,407 A | 5/1992 | Ono et al. |
| 5,212,119 A | 5/1993 | Hah et al. |
| 5,271,972 A | 12/1993 | Kwok et al. |
| 5,279,784 A | 1/1994 | Bender et al. |
| 5,364,488 A | 11/1994 | Minato et al. |
| 5,393,708 A | 2/1995 | Hsia et al. |
| 5,426,076 A | 6/1995 | Moghadam |
| 5,434,109 A | 7/1995 | Geissler et al. |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,578,532 A | 11/1996 | van de Ven et al. |
| 5,587,014 A | 12/1996 | Iyechika et al. |
| 5,593,741 A | 1/1997 | Ikeda |
| 5,620,525 A | 4/1997 | van de Ven et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,843,233 A | 12/1998 | van de Ven et al. |
| 5,853,607 A | 12/1998 | Zhao et al. |
| 5,882,417 A | 3/1999 | van de Ven et al. |
| 5,925,411 A | 7/1999 | van de Ven et al. |
| 5,926,737 A | 7/1999 | Ameen et al. |
| 5,935,340 A | 8/1999 | Xia et al. |
| 5,937,308 A | 8/1999 | Gardner et al. |
| 5,937,323 A | 8/1999 | Orczyk et al. |
| 5,961,850 A | 10/1999 | Satou et al. |
| 5,966,595 A | 10/1999 | Thakur et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,024,044 A | 2/2000 | Law et al. |
| 6,087,243 A | 7/2000 | Wang |
| 6,090,442 A | 7/2000 | Klaus et al. |
| 6,090,723 A | 7/2000 | Thakur et al. |
| 6,110,838 A | 8/2000 | Loewenstein |
| 6,114,219 A | 9/2000 | Spikes et al. |
| 6,121,130 A | 9/2000 | Chua et al. |
| 6,140,242 A | 10/2000 | Oh et al. |
| 6,146,970 A | 11/2000 | Witek et al. |
| 6,150,286 A | 11/2000 | Sun et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,191,004 B1 | 2/2001 | Hsiao |
| 6,207,587 B1 | 3/2001 | Li et al. |
| 6,211,040 B1 | 4/2001 | Liu et al. |
| 6,258,690 B1 | 7/2001 | Zenke |
| 6,287,962 B1 | 9/2001 | Lin |
| 6,296,255 B1 | 10/2001 | Hashimoto |
| 6,302,964 B1 | 10/2001 | Umotoy et al. |
| 6,339,997 B1 | 1/2002 | Nakagawa et al. |
| 6,355,581 B1 | 3/2002 | Vassiliev et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B2 | 9/2002 | Yau et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,583,063 B1 | 6/2003 | Khan et al. |
| 6,583,069 B1 | 6/2003 | Vassiliev et al. |
| 6,589,868 B2 | 7/2003 | Rossman |
| 6,596,654 B1 | 7/2003 | Bayman et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,656,804 B2 | 12/2003 | Tsujikawa et al. |
| 6,660,391 B1 | 12/2003 | Rose et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,800,571 B2 | 10/2004 | Cheung et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,833,578 B1 | 12/2004 | Tu et al. |
| 6,835,278 B2 | 12/2004 | Selbrede et al. |
| 6,849,520 B2 | 2/2005 | Kim et al. |
| 6,858,523 B2 | 2/2005 | Deboer et al. |
| 6,858,533 B2 | 2/2005 | Chu et al. |
| 6,867,086 B1 | 3/2005 | Chen et al. |
| 6,872,323 B1 | 3/2005 | Entley et al. |
| 6,875,687 B1 | 4/2005 | Weidman et al. |
| 6,890,403 B2 | 5/2005 | Cheung |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,514,375 B1 | 4/2009 | Shanker et al. |
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,622,369 B1 | 11/2009 | Lee et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |

(56) References Cited

U.S. PATENT DOCUMENTS

| | | |
|---|---|---|
| 7,867,923 B2 | 1/2011 | Mallick et al. |
| 7,902,080 B2 | 3/2011 | Chen et al. |
| 7,915,139 B1 | 3/2011 | Lang et al. |
| 7,935,643 B2 | 5/2011 | Liang et al. |
| 7,943,514 B2 | 5/2011 | West |
| 7,943,531 B2 | 5/2011 | Nemani et al. |
| 7,989,365 B2 | 8/2011 | Park et al. |
| 7,994,019 B1 | 8/2011 | Kweskin et al. |
| 8,119,544 B2 | 2/2012 | Hasebe et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,264,066 B2 | 9/2012 | Lo et al. |
| 8,304,351 B2 | 11/2012 | Wang et al. |
| 8,318,584 B2 | 11/2012 | Li et al. |
| 8,445,078 B2 | 5/2013 | Liang et al. |
| 8,449,942 B2 | 5/2013 | Liang et al. |
| 8,466,067 B2 | 6/2013 | Liang et al. |
| 8,466,073 B2 | 6/2013 | Wang et al. |
| 2001/0021595 A1 | 9/2001 | Jang |
| 2001/0029114 A1 | 10/2001 | Vulpio et al. |
| 2001/0038919 A1 | 11/2001 | Berry et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0027286 A1 | 3/2002 | Sundararajan et al. |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0081842 A1 | 6/2002 | Sambucetti et al. |
| 2002/0086166 A1 | 7/2002 | Hendricks et al. |
| 2002/0119607 A1 | 8/2002 | Miyasaka et al. |
| 2002/0127350 A1 | 9/2002 | Ishikawa et al. |
| 2002/0129769 A1 | 9/2002 | Kim et al. |
| 2002/0142585 A1 | 10/2002 | Mandal |
| 2002/0146879 A1 | 10/2002 | Fu et al. |
| 2002/0160585 A1 | 10/2002 | Park |
| 2002/0164421 A1 | 11/2002 | Chiang et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1 | 12/2002 | Ballantine et al. |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0203653 A1 | 10/2003 | Buchanan et al. |
| 2003/0207561 A1 | 11/2003 | Dubin et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0065253 A1 | 4/2004 | Pois et al. |
| 2004/0079118 A1 | 4/2004 | M'Saad et al. |
| 2004/0082131 A1 | 4/2004 | Tsujikawa et al. |
| 2004/0084680 A1 | 5/2004 | Ruelke et al. |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0183202 A1 | 9/2004 | Usami |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0216844 A1 | 11/2004 | Janakiraman et al. |
| 2004/0219780 A1 | 11/2004 | Ohuchi |
| 2004/0224534 A1 | 11/2004 | Beulens et al. |
| 2004/0231590 A1 | 11/2004 | Ovshinsky |
| 2004/0241342 A1 | 12/2004 | Karim et al. |
| 2004/0253826 A1 | 12/2004 | Ivanov et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0042889 A1 | 2/2005 | Lee et al. |
| 2005/0062165 A1 | 3/2005 | Saenger et al. |
| 2005/0087140 A1 | 4/2005 | Yuda et al. |
| 2005/0112901 A1 | 5/2005 | Ji et al. |
| 2005/0118794 A1 | 6/2005 | Babayan et al. |
| 2005/0121145 A1 | 6/2005 | Du Bois et al. |
| 2005/0142895 A1 | 6/2005 | Ingle et al. |
| 2005/0153574 A1 | 7/2005 | Mandal |
| 2005/0160974 A1 | 7/2005 | Ivanov et al. |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2005/0287775 A1 | 12/2005 | Hasebe et al. |
| 2006/0011984 A1 | 1/2006 | Curie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046427 A1 | 3/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0102977 A1 | 5/2006 | Fucsko et al. |
| 2006/0105106 A1 | 5/2006 | Balseanu et al. |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0158101 A1 | 7/2006 | Camilletti et al. |
| 2006/0159847 A1 | 7/2006 | Porter et al. |
| 2006/0160372 A1 | 7/2006 | Dorfman |
| 2006/0162661 A1 | 7/2006 | Jung et al. |
| 2006/0178018 A1 | 8/2006 | Olsen |
| 2006/0211265 A1 | 9/2006 | Trott |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0263522 A1 | 11/2006 | Byun |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0010072 A1 | 1/2007 | Bailey et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |

(56) References Cited

U.S. PATENT DOCUMENTS

| | | |
|---|---|---|
| 2007/0032054 A1 | 2/2007 | Ramaswamy et al. |
| 2007/0049044 A1 | 3/2007 | Marsh |
| 2007/0065578 A1 | 3/2007 | McDougall |
| 2007/0066022 A1 | 3/2007 | Chen et al. |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0111546 A1 | 5/2007 | Iyer et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014711 A1 | 1/2008 | Choi et al. |
| 2008/0014759 A1 | 1/2008 | Chua et al. |
| 2008/0020591 A1 | 1/2008 | Balseanu et al. |
| 2008/0026597 A1 | 1/2008 | Munro et al. |
| 2008/0038486 A1 | 2/2008 | Treichel et al. |
| 2008/0063809 A1 | 3/2008 | Lee et al. |
| 2008/0070409 A1 | 3/2008 | Park et al. |
| 2008/0081104 A1 | 4/2008 | Hasebe et al. |
| 2008/0085607 A1 | 4/2008 | Yu et al. |
| 2008/0096364 A1 | 4/2008 | Wilson et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0054674 A1 | 2/2009 | Lukas et al. |
| 2009/0061647 A1 | 3/2009 | Mallick et al. |
| 2009/0075490 A1 | 3/2009 | Dussarrat |
| 2009/0093132 A1 | 4/2009 | Xu et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0104798 A1 | 4/2009 | Hirano |
| 2009/0142935 A1 | 6/2009 | Fukazawa et al. |
| 2009/0170282 A1 | 7/2009 | Dong |
| 2009/0181550 A1 | 7/2009 | Hasebe et al. |
| 2009/0194809 A1 | 8/2009 | Cho |
| 2009/0203225 A1 | 8/2009 | Gates et al. |
| 2009/0206409 A1 | 8/2009 | Arisumi et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0052066 A1 | 3/2010 | Yu et al. |
| 2010/0059889 A1 | 3/2010 | Gosset et al. |
| 2010/0081094 A1 | 4/2010 | Hasebe et al. |
| 2010/0081293 A1 | 4/2010 | Mallick et al. |
| 2010/0099236 A1 | 4/2010 | Kwon et al. |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190317 A1 | 7/2010 | Iwasawa et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0227276 A1 | 9/2010 | Mizuno |
| 2010/0255655 A1 | 10/2010 | Mallick et al. |
| 2010/0261318 A1 | 10/2010 | Feng et al. |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0186990 A1 | 8/2011 | Mawatari et al. |
| 2011/0187000 A1 | 8/2011 | West |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0074387 A1 | 3/2012 | King |
| 2012/0079982 A1 | 4/2012 | Lubomirsky et al. |
| 2012/0083133 A1 | 4/2012 | Solis et al. |
| 2012/0094476 A1 | 4/2012 | Tanaka et al. |
| 2012/0111831 A1 | 5/2012 | Ha |
| 2012/0122302 A1 | 5/2012 | Weidman et al. |
| 2012/0142192 A1 | 6/2012 | Li et al. |
| 2012/0145079 A1 | 6/2012 | Lubomirsky et al. |
| 2012/0161405 A1 | 6/2012 | Mohn et al. |
| 2012/0177846 A1 | 7/2012 | Li et al. |
| 2012/0190178 A1 | 7/2012 | Wang et al. |
| 2012/0193778 A1 | 8/2012 | Mawatari |
| 2012/0213940 A1 | 8/2012 | Mallick |
| 2012/0225565 A1 | 9/2012 | Bhatia et al. |
| 2012/0238108 A1 | 9/2012 | Chen et al. |
| 2012/0269989 A1 | 10/2012 | Liang et al. |
| 2012/0292720 A1 | 11/2012 | Chen et al. |
| 2012/0309205 A1 | 12/2012 | Wang et al. |
| 2013/0062736 A1 | 3/2013 | Brighton et al. |
| 2013/0084711 A1 | 4/2013 | Liang et al. |
| 2013/0149462 A1 | 6/2013 | Liang et al. |
| 2013/0193578 A1 | 8/2013 | Yu et al. |

FOREIGN PATENT DOCUMENTS

| | | | |
|---|---|---|---|
| EP | 1095958 | B1 | 5/2001 |
| EP | 1717848 | A | 11/2006 |
| JP | 61-234534 | A | 10/1986 |
| JP | 64-048425 | A | 2/1989 |
| JP | 1-198033 | A | 8/1989 |
| JP | 01-235259 | A | 9/1989 |
| JP | 01241826 | | 9/1989 |
| JP | 03-197684 | A | 8/1991 |
| JP | 03-286531 | | 12/1991 |
| JP | 2004-328825 | | 11/1992 |
| JP | 05-259156 | | 10/1993 |
| JP | 05-304147 | A | 11/1993 |
| JP | 06-077150 | A | 3/1994 |
| JP | 6-168930 | A | 6/1994 |
| JP | 07-014826 | A | 1/1995 |
| JP | 07-169762 | A | 7/1995 |
| JP | 07-316823 | A | 12/1995 |
| JP | 08-236518 | A | 9/1996 |
| JP | 08-288286 | A | 11/1996 |
| JP | 09-237785 | A | 9/1997 |
| JP | 10-163183 | A | 6/1998 |

(56) References Cited

FOREIGN PATENT DOCUMENTS

| | | |
|---|---|---|
| JP | 11-274285 A | 10/1999 |
| JP | 2001-148382 A | 5/2001 |
| JP | 2002-370059 A | 12/2002 |
| JP | 2003-179054 | 6/2003 |
| JP | 2004-012315 | 1/2004 |
| JP | 2004-327639 | 11/2004 |
| JP | 2005-142448 A | 6/2005 |
| JP | 2005-268396 A | 9/2005 |
| JP | 2005-302848 A | 10/2005 |
| JP | 2008-159824 A | 7/2008 |
| JP | 2008/218684 A | 9/2008 |
| JP | 2011-220127 A | 11/2011 |
| KR | 10-2004-0091978 A | 11/2004 |
| KR | 1020040104533 A | 12/2004 |
| KR | 10-2005-003758 A | 1/2005 |
| KR | 10-2005-0072332 | 7/2005 |
| KR | 10-2005-0085838 | 8/2005 |
| KR | 10-2005-0094183 A | 9/2005 |
| KR | 1020060081350 A | 7/2006 |
| KR | 10-2009-0011765 A | 2/2009 |
| KR | 10-2009-0121361 | 11/2009 |
| KR | 10-2009-0122860 A | 12/2009 |
| KR | 10-2010-0085743 | 7/2010 |
| TW | 200514163 | 4/2005 |
| TW | 200707582 | 2/2007 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |
| WO | 2009/055340 A1 | 4/2009 |
| WO | WO-2010-080216 * | 7/2010 |
| WO | 2012/145148 A2 | 10/2012 |
| WO | 2013/025336 | 2/2013 |

OTHER PUBLICATIONS

International Search Report and Written Opinion of PCT/US2011/066275, mailed Sep. 24, 2012, 9 pages.
International Search Report and Written Opinion of PCT/US2012/026786, mailed Jan. 2, 2013, 7 pages.
International Search Report and Written Opinion of PCT/US2012/031640 mailed Oct. 18, 2012, 10 pages.
International Search Report and Written Opinion of PCT/US2012/039629, mailed Dec. 26, 2012, 6 pages.
Tripp, et al., "The Anodic Oxidation of Silicon Nitride Films on Silicon," Journal of the Electrochemical Society, 1970, pp. 157-159, 117(2).
Usenko, et al., "Silicon Nitride Surface Conversion into Oxide to Enable Hydrophilic Bonding," ECS Meeting Abstracts, 2010, 1 page, Abstract #1716, 218th ECS Meeting.
Alexandrov, S. E., et al., "Formation of Silicon Nitride Films by Remote Plasma-enhanced Chemical Vapour Deposition". Advanced Materials for Optics and Electronics, vol. 2, 301-312 (1993).
Bowen, C., et al., "New Processing Techniques: Sweeping of Quartz Wafers and a Practical Method for Processing Quartz Resonators Under Controlled Conditions," Proceedings of the 1992 IEEE Frequency Control Symposium, pp. 648-656.
International Search Report and Written Opinion of PCT/US2011/054635, mailed Jul. 9, 2012, 11 pages.
International Search Report and Written Opinion of PCT/US2011/054981, mailed May 9, 2012, 10 pages.
International Search Report and Written Opinion of PCT/US2011/054984, mailed May 11, 2012, 10 pages.
International Search Report and Written Opinion of PCT/US2011/066601, mailed Jul. 20, 2012, 10 pages.
Loboda, M.J., et al., "Chemical influence of inert gas on the thin film stress in plasma-enhanced chemical vapor deposited a- SiN:H films". Journal of Materials Research, vol. 11, No. 2, Feb. 1996, pp. 391-398.
Aylett, B. J. et al., "Silicon-Nitrogen Compounds. Part V. Diphenylamino-derivatives of Silane," J. Chem. Soc. (A), Apr. 1969, pp. 636-638.

Aylett, B. J. et al., "Silicon-Nitrogen Compounds. Part VI.[1] The Preparation and Properties of Disilazane," J. Chem. Soc. (A), Apr. 1969, pp. 639-642.
Aylett, B. J. et al., "The Preparation and Some Properties of Disilylamine-Correspondence," Inorganic Chemistry, Jan. 1966, p. 167.
Beach, David B., "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31 No. 20.
Burg, Anton B. et al., "Silyl-Amino Boron Compounds," J. Amer. Chem. Soc., Jul. 1950, pp. 3103-3107, vol. 72.
Coltrin, M.E., et al., "Chemistry of AlGaN Particulate Formation," National Nuclear Security Administration, Physical, Chemical, & Nano Sciences Center, Research Briefs, 2005, pp. 42-43.
Davison, A et al., "The Raman Spectra of Manganese and Rhenium Carbonyl Hydrides and Some Related Species," Inorganic Chemistry, Apr. 1967, pp. 845-847, vol. 6 No. 4.
Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.
Gulleri, G. et al., "Deposition Temperature Determination of HDPCVD Silicon Dioxide Films," 2005, Microelectronic Engineering, vol. 82, pp. 236-241.
Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.
Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.
Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.
Norman, Arlan D. et al., "Reaction of Silylphosphine with Ammonia," Inoragnic Chemistry, Jun. 1979, pp. 1594-1597, vol. 18 No. 6.
Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.
Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.
Ward, L. G. L. et al., "The Preparation and Properties of Bis-Disilanyl Sulphide and Tris-Disilanylamine," J. Inorg. Nucl. Chem., Dec. 1961, pp. 287-293, vol. 21, Pergamon Press Ltd., Northern Ireland.
Ward, Laird G. L., "Bromosilane, Iodosilane, and Trisilylamine," Inorganic Syntheses, 1968, pp. 159-170, vol. 11.
Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.
International Search Report and Written Opinion of PCT/US2012/053999, mailed Feb. 27, 2013, 12 pages.
International Search Report and Written Opinion of PCT/US2012/065086, mailed Mar. 25, 2013, 10 pages.
International Search Report and Written Opinion of PCT/US2012/059400, mailed Mar. 26, 2013, 11 pages.
Wang Li et al., "Properties of Hydrogenated Amorphous Silicon Caarbide Films Irradiated by Excimer Pulse Laser," 1998, Abstract Only.
Ying-Yu et al., "Preparation of SiC Thin Film Using Organosilicon by Remote Plasma CVD Method," 1999, Abstract Only.

* cited by examiner

TWO SILICON-CONTAINING PRECURSORS FOR GAPFILL ENHANCING DIELECTRIC LINER

CROSS-REFERENCES TO RELATED APPLICATIONS

This application claims the benefit of U.S. Prov. Pat. App. No. 61/393,604 filed Oct. 15, 2010, and titled "TWO SILICON-CONTAINING PRECURSORS FOR GAPFILL ENHANCING DIELECTRIC LINER," which is incorporated herein by reference for all purposes.

BACKGROUND OF THE INVENTION

The fabrication sequence of integrated circuits often includes several patterning processes. The patterning processes may be used to define a layer of conducting features which may be formed in metal, polysilicon or doped silicon. Thereafter, electrically isolating structures may be formed by depositing dielectric material on the patterned layer which includes trenches located between electrically active regions. The dielectric material provides electrical isolation within the plane of deposition but also between vertically separated layers of conducting features.

A challenge associated with the formation of sub-micron devices is filling a narrow trench in a void-free manner. To fill a trench with silicon oxide, a layer of silicon oxide is first deposited on the patterned substrate. The silicon oxide layer typically covers the field, as well as walls and bottom of the trench. If the trench is wide and shallow, it is relatively easy to completely fill the trench. As the trench gets narrower and the aspect ratio (the ratio of the trench height to the trench width) increases, it becomes more likely that the opening of the trench will be closed (or "pinched off") before the trench is completely filled.

Pinching off a trench may trap a void within the trench. Under certain conditions, the void will be filled during a reflow process, for example where the deposited silicon oxide is doped and experiences viscous flow at elevated temperatures. However, as the trench becomes narrower, even reflow processes may have difficulty filling the void. Moreover, several types of applications call for the deposition of lightly or undoped silicon oxide, which can be difficult to reflow even at an elevated temperature. Voids resulting from pinching-off are undesirable as they can reduce the performance and yield of good chips per wafer as well as the reliability of the devices.

Flowing tetraethyl orthosilicate ($C_8H_{20}O_4Si$) and ozone ($O_3$) to a semiconductor processing chamber is a technique used to create a silicon oxide film which can fill high aspect ratio trenches well due to the high initial mobility on the substrate. Trenches can be filled without voids at relatively high substrate temperatures (above 600° C.). Additional reactants may be used such as water vapor to enhance the gapfill capability of the film and reduce or eliminate the need to reflow the film in a subsequent step. Using similar precursors at lower substrate temperatures results in uneven growth rates and rough films. Film growth rate irregularities can act to trap voids within a trench thereby reducing the benefits of using a tetraethyl orthosilicate/ozone process.

Therefore, it is desirable to be able to fill narrow trenches with silicon oxide films at lower temperatures without leaving voids.

BRIEF SUMMARY OF THE INVENTION

Aspects of the disclosure pertain to methods of depositing silicon oxide layers on substrates. In embodiments, silicon oxide layers are deposited by flowing a silicon-containing precursor having a Si—O bond, an oxygen-containing precursor and a second silicon-containing precursor, having both a Si—C bond and a Si—N bond, into a semiconductor processing chamber to form a conformal liner layer. Upon completion of the liner layer, a gap fill layer is formed by flowing a silicon-containing precursor having a Si—O bond, an oxygen-containing precursor into the semiconductor processing chamber. The presence of the conformal liner layer improves the ability of the gap fill layer to grow more smoothly, fill trenches and produce a reduced quantity and/or size of voids within the silicon oxide filler material.

Embodiments of the invention include methods for filling a trench with silicon oxide wherein the trench is on a substrate within a substrate processing region of a semiconductor processing chamber. The methods include forming a conformal silicon oxide liner layer by concurrently flowing a first silicon-containing precursor, a second silicon-containing precursor and an oxygen-containing precursor into the substrate processing region. The first silicon-containing precursor comprises a Si—O bond, and the second silicon-containing precursor comprises a Si—C bond and a Si—N bond. The methods further include forming a silicon oxide gapfill layer by concurrently flowing the first silicon-containing precursor and the oxygen-containing precursor into the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Aspects of the disclosure pertain to methods of depositing silicon oxide layers on substrates. In embodiments, silicon oxide layers are deposited by flowing a silicon-containing precursor having a Si—O bond, an oxygen-containing precursor and a second silicon-containing precursor, having both a Si—C bond and a Si—N bond, into a semiconductor processing chamber to form a conformal liner layer. Upon completion of the liner layer, a gap fill layer is formed by flowing a silicon-containing precursor having a Si—O bond, an oxygen-containing precursor into the semiconductor processing chamber. The presence of the conformal liner layer improves the ability of the gap fill layer to grow more smoothly, fill trenches and produce a reduced quantity and/or size of voids within the silicon oxide filler material.

Embodiments of the invention are directed to methods of forming silicon oxide in trenches on a patterned surface of a substrate. A conformal silicon oxide liner layer is formed using two silicon-containing precursors and a gapfill silicon oxide layer is formed without one of the two silicon-containing precursors in embodiments of the invention. The inclusion of the second silicon-containing precursor lowers the flowability of the liner layer and increases the evenness of the growth-front. Once the silicon oxide liner layer is completed, the more flowable gapfill silicon oxide layer can penetrate the remaining gap more easily. Without wishing to bind the coverage of the claims to hypothetical mechanisms which may or may not be correct, it is possible that the surface of the silicon oxide liner layer offers more nucleation sites for the growth of the gapfill silicon oxide layer. The second silicon-containing precursor may adsorb with less site-selectivity than the first silicon-containing precursor.

Sub-atmospheric CVD (SACVD) and related processes involve flowing a silicon-containing precursor and an oxygen-containing precursor into a semiconductor processing chamber to form silicon oxide on the substrate. The silicon-containing precursor may include, e.g., tetraethyl orthosilicate and the oxygen-containing precursor may include ozone ($O_3$), oxygen ($O_2$) and/or oxygen radicals. Other reactant(s), e.g. water vapor, may be added to the substrate processing region to enhance the gapfill capability of deposited material during formation of an SACVD film. Despite the canonical but unfortunate acronym for the technique, it should be noted that SACVD processes can run quite close or even above atmospheric pressures. The process pressures of the methods presented herein may be above or below atmospheric or ambient pressure in embodiments of the invention. The pressure in the substrate processing region may also be about or below 700 torr or 600 torr during the deposition of the conformal silicon oxide liner layer and/or the deposition of the silicon oxide gapfill layer in disclosed embodiments as described herein. Silicon oxide films grown from tetraethyl orthosilicate and ozone on substrates below about 600° C. have been found to have rough surfaces which can be seen with a variety of surface imaging techniques, such as atomic force microscopy. The addition of the second silicon-containing precursor, e.g. hexamethyl disilazane or tetramethyl disilazane, has been found to result in less surface roughness following deposition. The incorporation of these second silicon-containing precursors is helpful during the formation of a liner layer which is described in more detail in the following discussion of an exemplary gapfill process.

Figure 1:
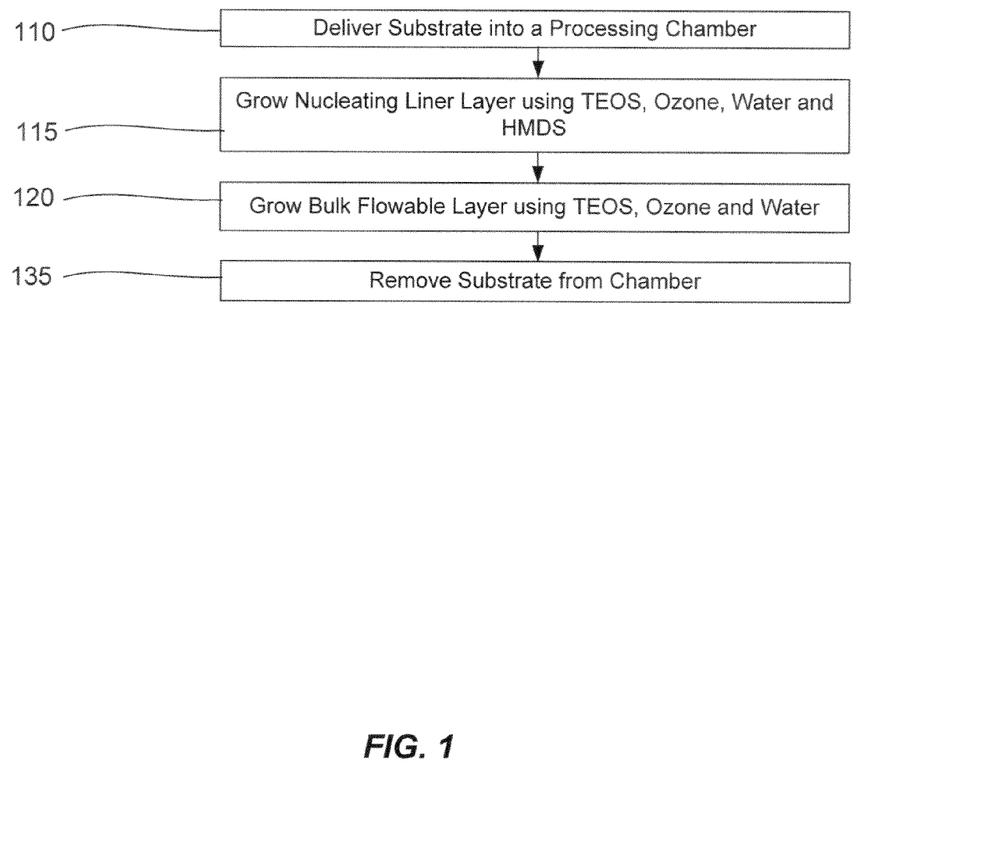
FIG. 1 is a flow chart of a silicon oxide gapfill deposition process according to disclosed embodiments.

In order to better understand and appreciate the invention, reference is now made to FIG. 1 which is a flow chart of a silicon oxide gapfill deposition process according to disclosed embodiments. The process begins when a patterned substrate is transferred into a semiconductor processing chamber (operation 110). Ozone ($O_3$), water vapor ($H_2O$), tetraethyl orthosilicate (chemical formula $Si(OC_2H_5)_4$) and hexamethyl disilazane (chemical formula $(CH_3)_3SiNHSi(CH_3)_3$) are concurrently flowed into the substrate processing region in operation 115 to form a conformal silicon oxide liner layer. The silicon oxide liner layer grows smoothly as a result of the presence of the second silicon-containing precursor, namely hexamethyl disilazane in this example. The growth front of the film progresses substantially uniformly, in embodiments, outward from the patterned surface. Growth of the conformal silicon oxide liner layer is stopped before the growth fronts meet to substantially fill a trench. The remaining gap is then filled by a gapfill silicon oxide layer by concurrently flowing water vapor, ozone and tetraethyl orthosilicate into the substrate processing region (operation 120). The presence of the conformal silicon oxide liner layer allows the gapfill silicon oxide layer to fill the remaining gap without leaving voids, pinholes or seams, in embodiments of the invention. Following the growth of the film, the substrate is removed from the chamber in operation 135. Generally speaking, the flow of water vapor is present during the growth of both, neither or either of the conformal silicon oxide liner layer and the gapfill silicon oxide layer. In other words, the water vapor is optional.

The thickness of conformal silicon oxide liner layers may be less than or about 40 nm, less than or about 30 nm, less than or about 25 nm, less than or about 20 nm, less than or about 15 nm or less than or about 10 nm in disclosed embodiments. The thickness may be between about 5 nm and about 30 nm or between about 5 nm and about 20 nm in embodiments to create enough nucleation sites to enable smooth growth of the gapfill silicon oxide layer but to avoid completely filling a trench. The gapfill silicon oxide layer is deposited over the relatively thin conformal silicon oxide liner layer.

Figure 2A:
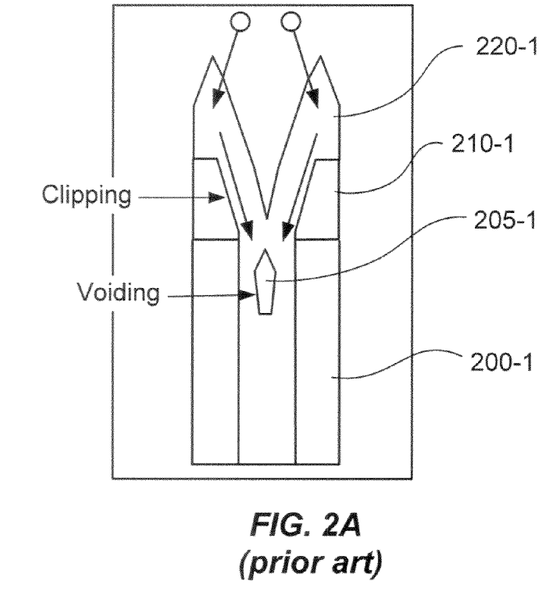
FIGS. 2A-2C are schematic cross-sectional views of silicon-oxide gapfill processes involving prior art techniques compared with gapfill according to disclosed embodiments.
Figure 2B:
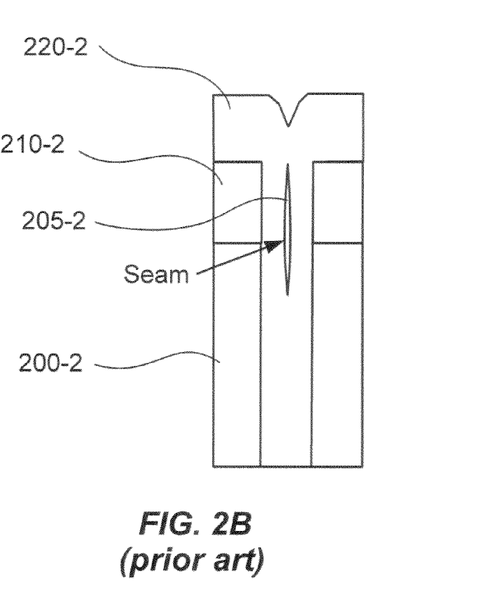
Figure 2C:
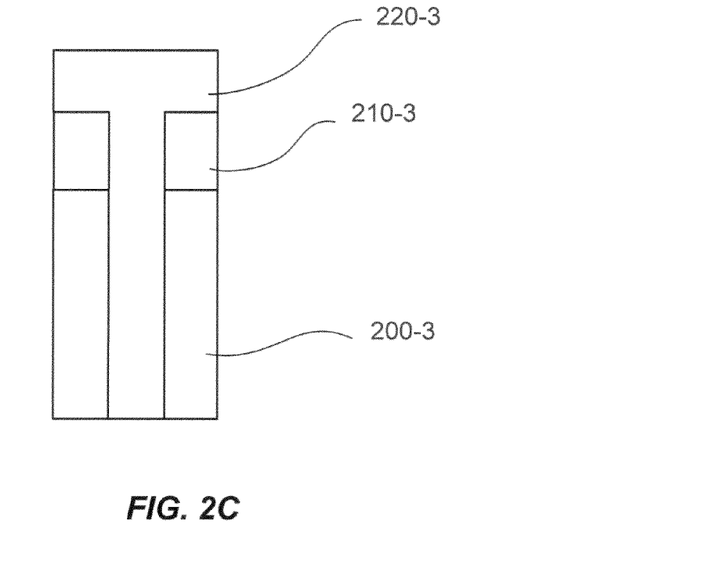

FIGS. 2A-2C and FIGS. 3A-3C are cross-sectional views of silicon oxide gapfill processes which show advantages of gapfill processes according to disclosed embodiments. FIG. 2A shows a schematic view of a narrow gap filled using traditional high-density plasma chemical vapor deposition (HDP-CVD). The bombardment of the surface by charged plasma effluents clip the edges near the top of the gaps. Clipping is shown in the schematic as occurring in a layer of silicon nitride 210-1. The lack of mobility of surface resident species also can result in the formation of a void 205-1 as the layer of silicon oxide 220-1 is formed in the trench (shown in the schematic as a trench into a silicon substrate 200-1). FIG. 2B shows a schematic view of a traditional high temperature SACVD process wherein the growth fronts of silicon oxide 220-2 meet near the center of the trench previously formed in silicon substrate 200-2 and silicon nitride 210-2 but may leave a void 205-2 (this time in the form of a seam). Seams and voids left by these traditional gapfill methods can be detrimental to completed device performance. FIG. 2C shows a schematic of a gapfill process according to embodiments of the invention. The trench includes an exposed silicon surface, an exposed silicon nitride surface, and an exposed silicon oxide surface upon which the conformal silicon oxide liner layer is formed. The conformal silicon oxide liner layer fills a portion of the trench and the gapfill silicon oxide layer fills the rest of the trench. The combination of both the liner layer and the gapfill layer (silicon oxide 220-3) fill the trench without leaving voids or seams. The process of filling the gap (especially with regard to the gapfill silicon oxide layer) may be described herein as a bottom-up gapfill process.

Figure 3A:
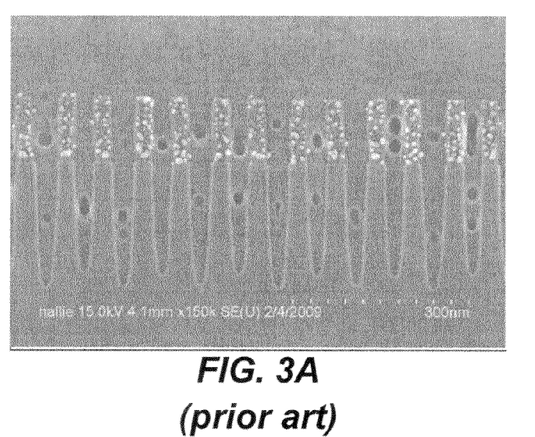
FIGS. 3A-3C are SEM cross-sectional views of silicon-oxide gapfill processes involving prior art techniques compared with gapfill processes according to disclosed embodiments.
Figure 3B:
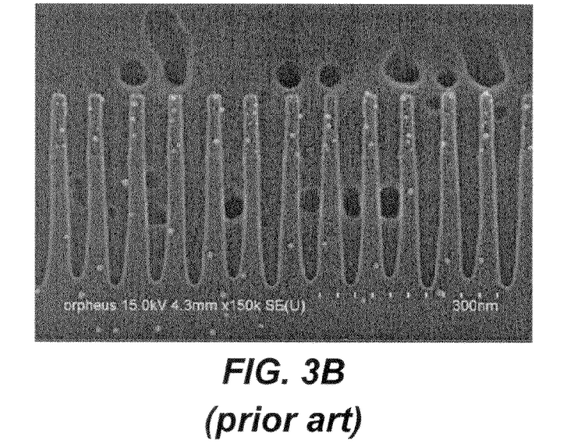
Figure 3C:
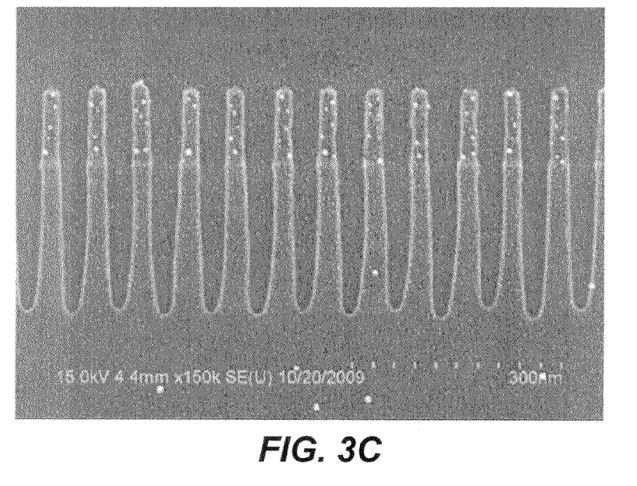

FIG. 3A shows an SEM cross-section of trenches filled with a traditional SACVD process at a relatively high substrate temperature (540° C.). The relatively high substrate temperature helps to reduce the incidence of voids by increasing the surface mobility of the forming silicon oxide. Nonetheless, voids can still be seen in the narrow trenches formed in silicon oxide and silicon nitride. FIG. 3B shows an SEM cross-section of trenches filled by a similar traditional SACVD process at lower substrate temperature (380° C.). Larger voids develop at the reduced substrate temperature, in part, as a result of the reduced surface mobility of the forming dielectric layer in comparison to deposition at a substrate temperature of 540° C. FIG. 3C shows an SEM cross-section of trenches filled with the process of FIG. 1 according to embodiments of the invention. The methods presented may avoid the creation of voids and seams within the trenches and also above the trenches. The reduction in voids (size and/or population) results in a denser film and has been found to result in a reduction in wet etch rate (WER) as well as an increase in refractive index (RI).

Generally speaking growing silicon oxide liner layers through the introduction of a first silicon-containing precursor having a Si—O bond and an oxygen precursor can be transformed into a more conformal process by further including a second silicon-containing precursor having a Si—C bond and a Si—N bond (the Si atom may or may not be the same atom for both bonds). The presence of such a silicon-containing precursor (e.g. tetramethyl disilazane (chemical formula $H(CH_3)_2SiNHSi(CH_3)_2H$) and/or hexamethyl disilazane) increases the conformality of the deposition perhaps by decrease the site selectivity of the film growth. Porous growth patterns may occur without the second silicon-containing precursor. These more complex growth patterns may trap voids regardless of whether the silicon oxide film is grown on patterned or blanket wafers in embodiments of the invention. The inventors have discovered that once a conformal silicon oxide liner is grown using the second silicon-containing precursor, the flow of that second silicon-containing precursor can be reduced or eliminated to grow a gapfill silicon oxide layer which produces few voids. The presence of the conformal silicon oxide liner appears to provide traditional SACVD chemistries with a higher density of nucleation sites which reduces porous growth modes in embodiments of the invention. The flow of the second silicon-containing precursor during growth of the bulk silicon oxide layer is less than the flow of the second silicon-containing precursor during growth of the conformal silicon oxide liner layer in an embodiment. In another embodiment, there is essentially no flow of the second silicon-containing precursor during growth of the bulk silicon oxide layer.

The flow rate of the first silicon-containing precursor may be about 500 mg per minute or greater or about 1 gm per minute or greater during deposition of either the liner layer or the bulk gapfill layers in embodiments of the invention. Flow rates, as used herein, are not necessarily constant during the process. Flow rates of the different precursors may be initiated and terminated in different orders and their magnitudes may be varied. Unless otherwise indicated, mass flow rate magnitudes indicated herein are given for the approximate peak flow rate used during the process. The flow rate of the second silicon-containing precursor (containing a Si—C bond and a Si—N bond) correlates with the reduction of roughness of the silicon oxide liner during and after deposition. Flow rate magnitudes indicated herein are for deposition on one side of a single 300 mm diameter wafer (area approximately 700 $cm^2$). Appropriate correction based on deposition area is needed for multiple wafers, larger or smaller wafers, double sided deposition or deposition on alternative geometry substrates (e.g. rectangular substrates). Regardless of underlying material differences, a flow rate of a second silicon-containing precursor accompanying the other precursors may improve the fill by decreasing the quantity and/or size of voids incorporated in a trench. In the case of 300 mm wafers or substrates of similar area, second silicon-containing precursor flow rates may be above or about 1 mg per minute, above or about 5 mg per minute, above or about 10 mg per minute, above or about 25 mg per minute, above or about 50 mg per minute or above or about 100 mg per minute, above or about 150 mg per minute, above or about 200 mg per minute, above or about 300 mg per minute or above or about 500 mg per minute at some or all points during the flow of precursors in different embodiments.

Generally speaking, the first silicon-containing precursor contains one or more Si—O bonds. The first silicon-containing precursor may include one or more of tetraethyl orthosilicate (sometimes referred to as TEOS), tetramethyl orthosilicate (chemical formula $Si(OCH_3)_4$, sometimes referred to as TMOS) and triethoxysilane (chemical formula $(C_2H_5O)_3SiH$, sometimes referred to as TRIES) in embodiments of the invention. Inclusion of a second silicon-containing precursor in a tetraethyl orthosilicate-ozone process has been found to reduce the roughness of the growing silicon oxide liner but also reduces the surface flowability of the deposited material (even if water vapor is included). As a result, the flow of the second-silicon-containing precursor must be reduced or eliminated to change the growth from conformal to flowable in order to fill the trench without forming a seam.

Measurements have been made which indicate that a lower flow rate of hexamethyl disilazane may be used to achieve similar results to tetramethyl disilazane. However, surface materials and surface conditions have been found to affect the efficacy of second silicon-containing precursors. The increasing flow rate may result in a higher refractive index and a lower wet etch rate for a portion of the silicon oxide film grown later in the film growth process.

The second silicon-containing precursor may be a variety of precursors which chemically interact with the substrate and have less site-selectivity than the first silicon-containing precursor (often tetraethyl orthosilicate). At low substrate temperatures, film growth with less or no second silicon-containing precursor results in preferential growth sites due, possibly, to increased reaction probabilities near nucleation sites. Descriptions of chemical mechanisms contained herein may be helpful in understanding embodiments of the invention but are not necessarily correct nor are they intended to limit the scope of the claims. The second silicon-containing precursor has both a Si—N bond and a Si—C bond (one or more of each type of bond in embodiments) which appears to lessen site-selectivity resulting in a more uniform silicon oxide growth rate when combined with the silicon-containing precursor and the oxygen-containing precursor. These second silicon-containing precursor may be tetramethyl disilazane or hexamethyl disilazane or another precursor containing at least one Si—C bond and at least one Si—N bond in disclosed embodiments.

The substrate temperature during deposition of conformal silicon oxide liner layers (or gapfill silicon oxide layers) may be below 600° C., below 540° C., below 500° C., below 400° C., below 350° C. or below 300° C. in different embodiments. The substrate temperature during the depositions may be above 100° C., above 150° C., above 200° C. or above 300° C. in different embodiments. Each of the lower bounds may be combined with any of the upper bounds on the substrate temperature to form additional ranges on the substrate temperature according to additional disclosed embodiments. The bilayers described herein (the liner and gapfill layers) may be used to fill trenches having a width of 100 nm or less, 50 nm or less, 40 nm or less, or 30 nm or less. A thickness of the conformal silicon oxide liner layer is less than half the width of the trenches and may be less than a quarter of the width of the trenches in embodiments of the invention. Additional process parameters will be presented in the course of describing an exemplary substrate processing system.

Exemplary Substrate Processing System

Figure 4A:
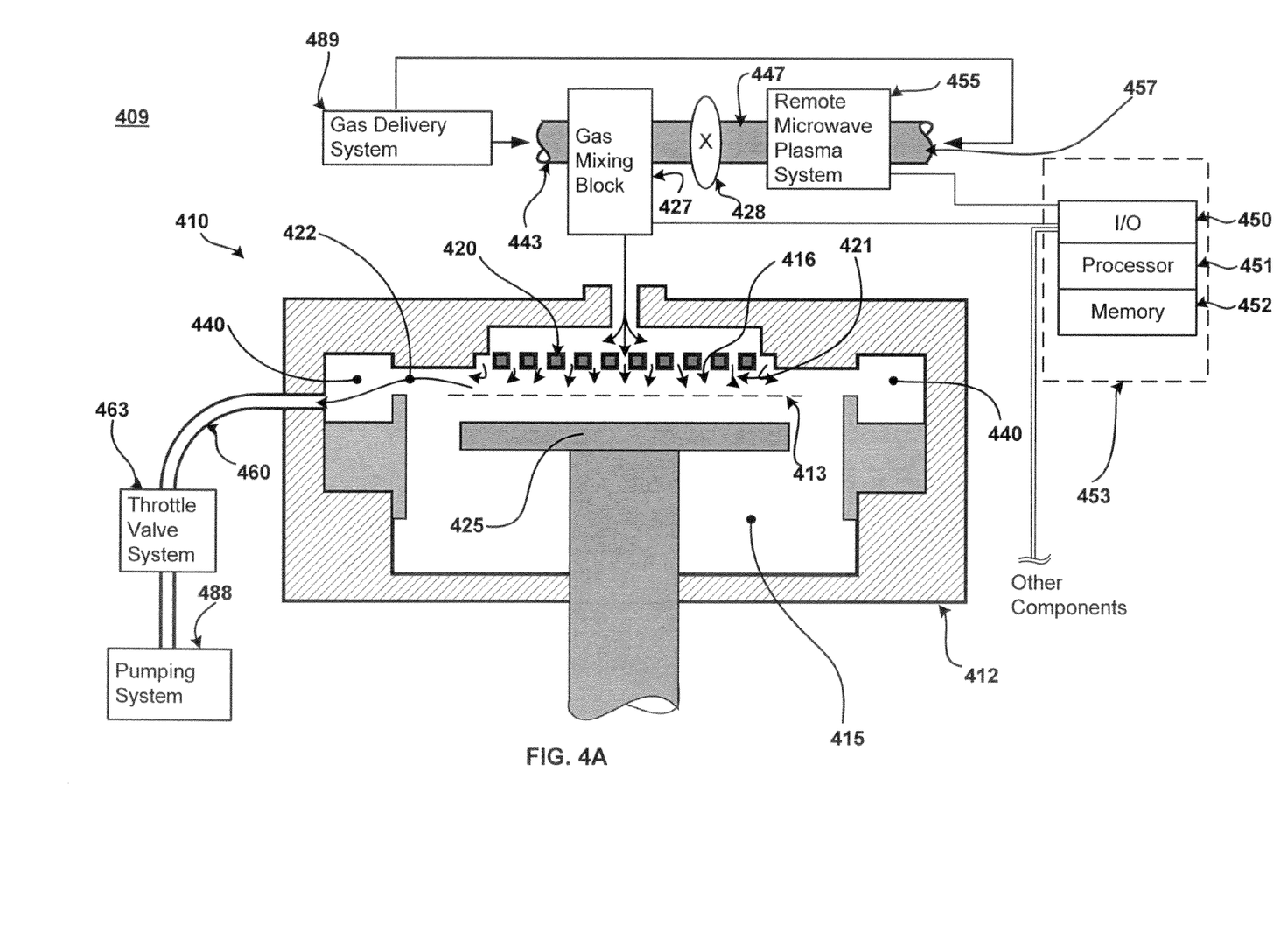
FIG. 4A shows a simplified representation of a semiconductor processing system according to embodiments of the present invention.

Having described modifications which may be made to and methods of using semiconductor processing systems according to embodiments of the present invention, attention is directed to FIG. 4A, which illustrates a simplified diagram of a semiconductor processing chamber 410 within a semiconductor processing tool 409. This system is suitable for performing a variety of semiconductor processing steps which may include CVD processes, as well as other processes, such as reflow, drive-in, cleaning, etching, and gettering processes. Multiple-step processes can also be performed on a single substrate without removing the substrate from the chamber. Representative major components of the system include a chamber interior 415 that receives process and other gases from a gas delivery system 489, pumping system 488, a remote plasma system (RPS) 455, and a system controller 453. These and other components are described below in order to understand the present invention.

The semiconductor processing chamber 410 includes an enclosure assembly 412 housing a chamber interior 415 with a gas reaction area 416. A gas distribution plate 420 is provided above the gas reaction area 416 for dispersing reactive gases and other gases, such as purge gases, through perforated holes in the gas distribution plate 420 to a substrate (not shown) that rests on a vertically movable heater 425 (which may also be referred to as a substrate support pedestal). Vertically movable heater 425 can be controllably moved between a lower position, where a substrate can be loaded or unloaded, for example, and a processing position closely adjacent to the gas distribution plate 420, indicated by a dashed line 413, or to other positions for other purposes, such as for an etch or cleaning process. A center board (not shown) includes sensors for providing information on the position of the substrate.

Gas distribution plate 420 may be of the variety described in U.S. Pat. No. 6,793,733. These plates improve the uniformity of gas disbursement at the substrate and are particularly advantageous in deposition processes that vary gas concentration ratios. In some examples, the plates work in combination with the vertically movable heater 425 (or movable substrate support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher). In other examples, the orifices of the gas distribution plate are designed to provide more uniform mixing of the gases.

Vertically movable heater 425 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of vertically movable heater 425 exposed within the chamber interior 415 are made of a ceramic material, such as aluminum oxide ($Al_2O_3$ or alumina) or aluminum nitride.

Reactive and carrier gases are supplied through process gas supply line 443 into a gas mixing box (also called a gas mixing block) 427, where they are preferably mixed together and delivered to the gas distribution plate 420. The gas mixing block 427 is preferably a dual input mixing block coupled to a process gas supply line 443 and to cleaning/etch gas conduit 447. Gate valve 428 operates to admit or seal gas or plasma from cleaning/etch gas conduit 447 to the gas mixing block 427. Cleaning/etch gas conduit 447 receives gases from a remote plasma system (RPS) 455, which has input line 457 for receiving input gases. During deposition processing, gas supplied to gas distribution plate 420 is vented toward the substrate surface (as indicated by gas supply arrows 421), where it may be uniformly distributed radially across the substrate surface, typically in a laminar flow.

Purging gas may be delivered into the chamber interior 415 through gas distribution plate 420 and/or an inlet port or tube (not shown) through a wall (preferably the bottom) of enclosure assembly 412. The purging gas flows upward from the inlet port past vertically movable heater 425 and to an annular pumping channel 440. An exhaust system then exhausts the gas (as indicated by gas exhaust arrow 422) into the annular pumping channel 440 and through an exhaust line 460 to a pumping system 488, which includes one or more vacuum pumps. Exhaust gases and entrained particles are drawn from the annular pumping channel 440 through the exhaust line 460 at a rate controlled by throttle valve system 463.

Remote plasma system (RPS 455) can produce a plasma for selected applications, such as chamber cleaning or etching native oxide or residue from a process substrate. Plasma species produced in the RPS 455 from precursors supplied via the input line 457 are sent via cleaning/etch gas conduit 447 for dispersion through gas distribution plate 420 to the gas reaction area 416. Precursor gases for a cleaning application may include fluorine, chlorine, and other reactive elements. RPS 455 also may be adapted to deposit plasma enhanced CVD films by selecting appropriate deposition precursor gases for use in RPS 455.

The system controller 453 controls activities and operating parameters of the deposition system. The processor 451 executes system control software, such as a computer program stored in a memory 452 coupled to the processor 451. The memory 452 typically consists of a combination of static random access memories (cache), dynamic random access memories (DRAM) and hard disk drives but of course the memory 452 may also consist of other kinds of memory, such as solid-state memory devices. In addition to these memory means the semiconductor processing tool 409 in a preferred embodiment includes a floppy disk drive, USB ports and a card rack (not shown).

The processor 451 operates according to system control software programmed to operate the device according to the methods disclosed herein. For example, sets of instructions may dictate the timing, mixture of gases, chamber pressure, chamber temperature, plasma power levels, susceptor position, and other parameters of a particular process. The instructions are conveyed to the appropriate hardware preferably through direct cabling carrying analog or digital signals conveying signals originating from an input-output I/O module 450. Other computer programs such as those stored on other memory including, for example, a USB thumb drive, a floppy disk or another computer program product inserted in a disk drive or other appropriate drive, may also be used to operate the processor 451 to configure the semiconductor processing tool 409 for varied uses.

The processor 451 may have a card rack (not shown) that contains a single-board computer, analog and digital input/output boards, interface boards and stepper motor controller boards. Various parts of the semiconductor processing tool 409 conform to the Versa Modular European (VME) standard which defines board, card cage, and connector dimensions and types. The VME standard also defines the bus structure having a 16-bit data bus and 24-bit address bus.

The embodiment disclosed herein relies on direct cabling and a single processor 451. Alternative embodiments comprising multi-core processors, multiple processors under distributed control and wireless communication between the system controller and controlled objects are also possible.

Figure 4B:
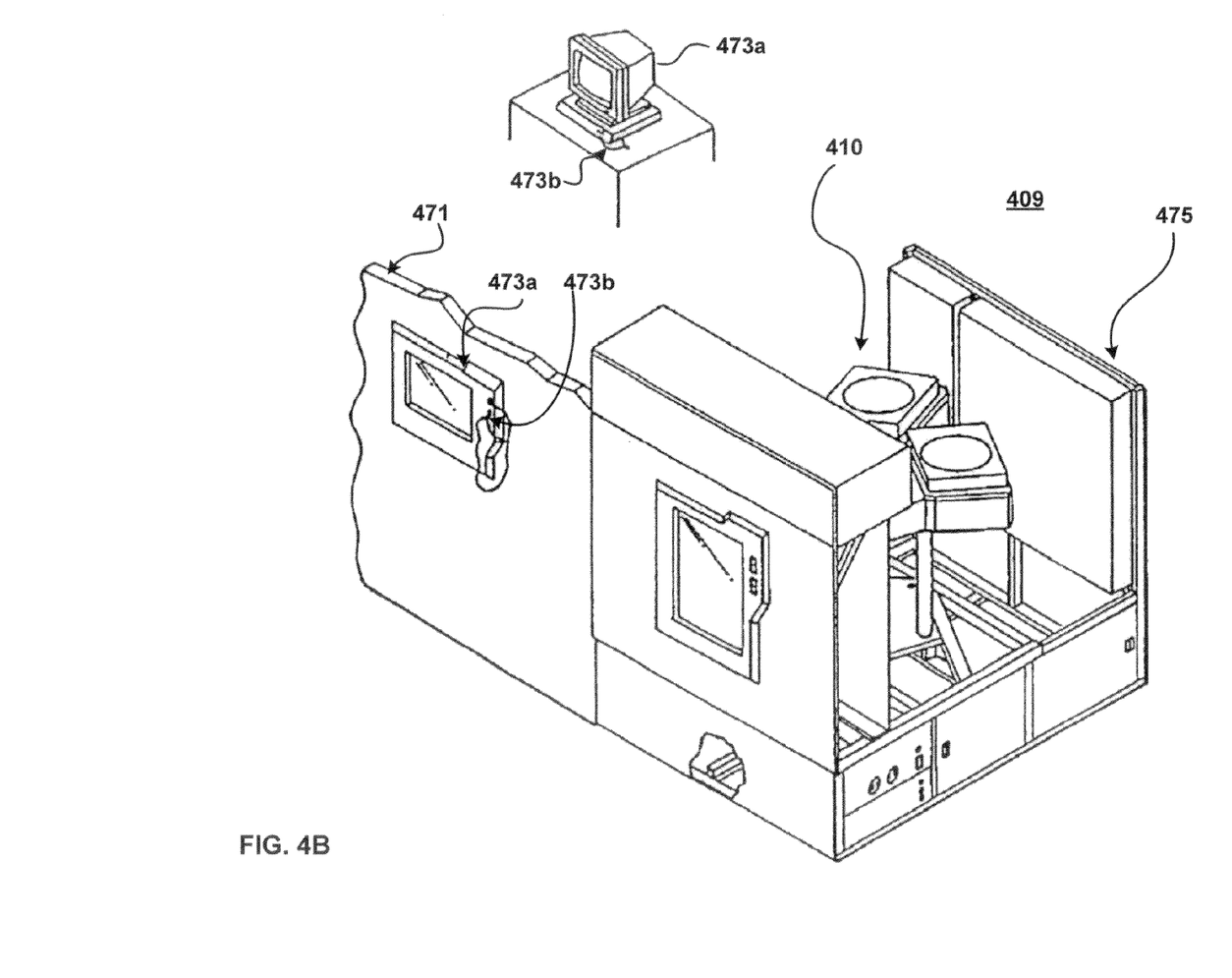
FIG. 4B shows a simplified representation of the user interface for a semiconductor processing system in relation to a semiconductor processing chamber in a multi-chamber system.

FIG. 4B is a simplified diagram of a user interface in relation to the semiconductor processing chamber 410. The semiconductor processing tool 409 may include more than one semiconductor processing chamber 410 as shown. Substrates may be transferred from one chamber to another for additional processing. In some cases the substrates are transferred under vacuum or a selected gas. The interface between a user and the processor is via monitor 473a and pointing device 473b. A mainframe unit 475 provides electrical, plumbing, and other support functions for semiconductor processing chamber 410. Exemplary mainframe units compatible with the illustrative embodiment of the semiconductor processing system are currently commercially available as the PRECISION 5000™, the CENTURA 5200™, PRODUCER GT™ and the PRODUCER SE™ systems from APPLIED MATERIALS, INC. of Santa Clara, Calif.

In some embodiments two monitors 473a are used, one mounted in clean room wall 471 for the operators, and the other behind clean room wall 471 for the service technicians. Both monitors 473a simultaneously display the same information, but only one pointing device 473b is enabled. The touched area changes its highlighted color, or a new menu or screen is displayed, confirming communication between the light pen and the display screen.

Figure 4C:
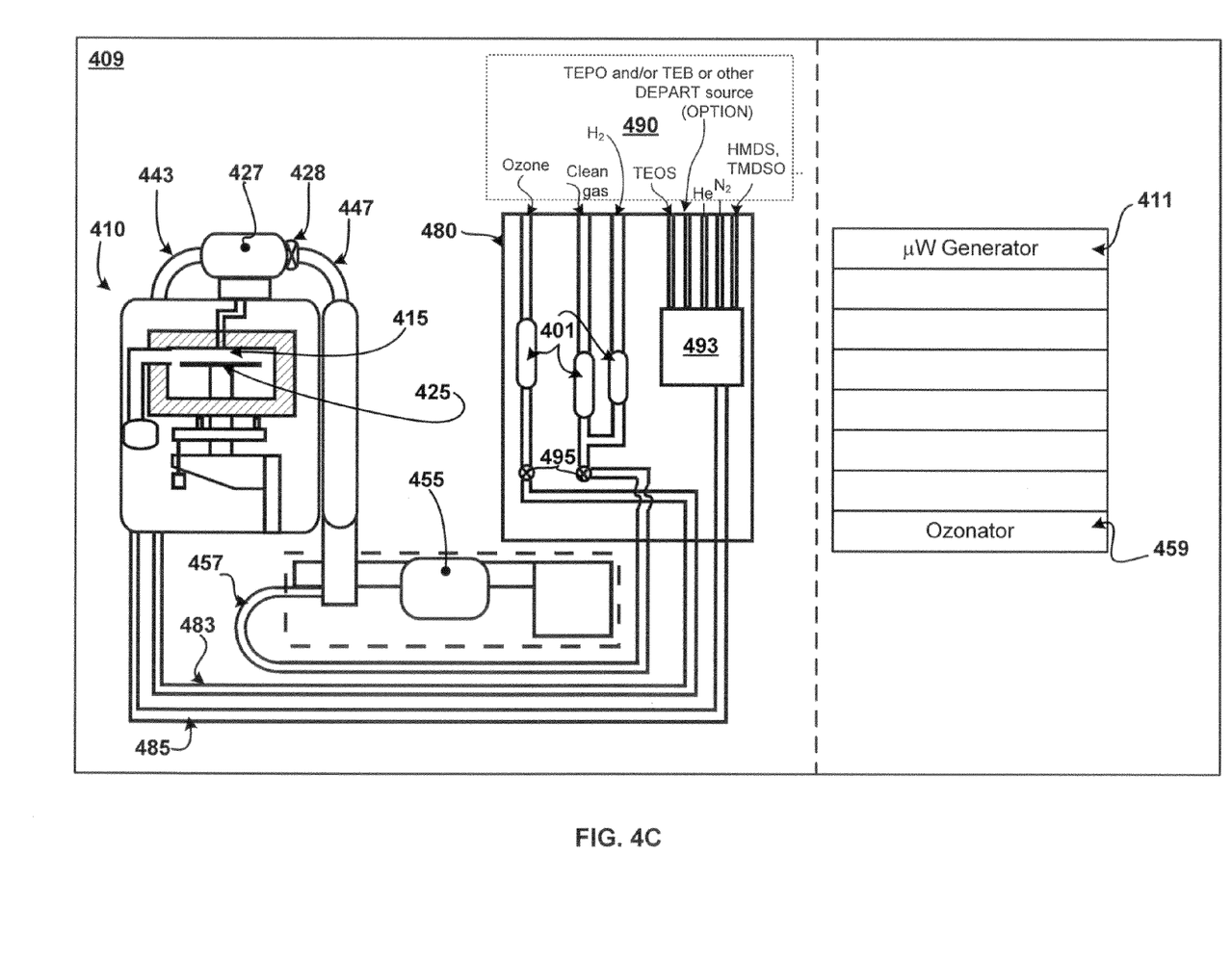
FIG. 4C shows a simplified diagram of a gas panel and supply lines in relation to a semiconductor processing chamber.

FIG. 4C illustrates a general overview of an embodiment of the semiconductor processing chamber 410 in relation to a gas supply panel 480 located in a clean room. As discussed above, the semiconductor processing tool 409 includes semiconductor processing chamber 410 with vertically movable heater 425, gas mixing block 427 with inputs from process gas supply line 443 and cleaning/etch gas conduit 447, and RPS 455 with input line 457. As mentioned above, the gas mixing block 427 is configured for mixing and injecting deposition gas(es) and cleaning gas(es) or other gas(es) through process gas supply line 443 and the input line 457 to the chamber interior 415.

RPS 455 is integrally located and mounted below semiconductor processing chamber 410 with cleaning/etch gas conduit 447 coming up alongside semiconductor processing chamber 410 to the gate valve 428 and the gas mixing block 427, located above semiconductor processing chamber 410. Plasma power generator 411 and ozonator 459 are located remote from the clean room. Supply lines 483 and 485 from the gas supply panel 480 provide reactive gases to process gas supply line 443. The gas supply panel 480 includes lines from reactant sources 490 (gas or liquid) that provide the process gases for the selected application. The gas supply panel 480 has gas mixing system 493 that mixes selected gases before flow to the gas mixing block 427. In some embodiments, gas mixing system 493 includes a liquid injection system for vaporizing reactant liquids such as tetraethyl orthosilicate ("TEOS"), triethyl borate ("TEB"), and triethyl phosphate ("TEPO"). Vapor from the liquids is usually combined with a carrier gas, such as helium. Supply lines for the process gases may include (i) shut-off valves 495 that can be used to automatically or manually shut off the flow of process gas into supply line 485 or input line 457, and (ii) liquid flow meters 401 or other types of controllers that measure the flow of gas or liquid through the supply lines.

As an example, a mixture including tetraethyl orthosilicate as a silicon source may be used with gas mixing system 493 in a deposition process for forming a silicon oxide film. Sources of dopants such as phosphorous and boron may include TEPO and TEB which may also be introduced to gas mixing system 493. Additionally, a second silicon-containing precursor such as tetramethyl disilazane or hexamethyl disilazane may be delivered to gas mixing system 493. Precursors delivered to gas mixing system 493 may be liquid at room temperature and pressure and may be vaporized by conventional boiler-type or bubbler-type hot boxes. Alternatively, a liquid injection system may be used and offers greater control of the volume of reactant liquid introduced into the gas mixing system. The liquid is typically injected as a fine spray or mist into the carrier gas flow before being delivered to supply line 485 (which may be heated) to the gas mixing block and chamber. Of course, it is recognized that other sources of dopants, silicon, oxygen and second silicon-containing precursors may also be used. Though shown as an individual gas distribution line, supply line 485 may actually comprise multiple lines separated to discourage inter-precursor reactions before the precursors are flowed into chamber interior 415. One or more sources, such as oxygen ($O_2$), ozone ($O_3$) and/or oxygen radicals (O) flow to the chamber through another supply line 483, to be combined with the reactant gases from supply line 485 near or in the chamber.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon oxide" may include concentrations of other elemental constituents such as nitrogen, hydrogen, carbon and the like. In some embodiments, silicon oxide consists essentially of silicon and oxygen. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A "gas" (or a "precursor") may be a combination of two or more gases (or "precursors") and may include substances which are normally liquid or solid but temporarily carried along with other "carrier gases" or "inert gases." The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low horizontal aspect ratio trench (as viewed from above) which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for filling a trench with silicon oxide wherein the trench is on a patterned substrate within a substrate processing region of a semiconductor processing chamber, the method comprising the sequential operations of:
    forming a conformal silicon oxide liner layer by concurrently flowing a first silicon-containing precursor, a second silicon-containing precursor and an oxygen-containing precursor into the substrate processing region, wherein the first silicon-containing precursor comprises a Si—O bond, and the second silicon-containing precursor comprises a Si—C bond and a Si—N bond; and
    forming a silicon oxide gapfill layer by concurrently flowing the first silicon-containing precursor and the oxygen-containing precursor into the substrate processing region.

2. The method of claim 1 wherein the first silicon-containing precursor comprises at least one precursor selected from the group consisting of tetraethyl orthosilicate, tetramethoxysilane and triethoxysilane.

3. The method of claim 2 wherein a flow rate of the first silicon-containing precursor is about 500 mg per minute or greater during deposition of the silicon oxide.

4. The method of claim 1 wherein the oxygen-containing precursor comprises at least one precursor selected from the group consisting of ozone ($O_3$), oxygen ($O_2$) and oxygen radicals (O).

5. The method of claim 1 wherein the method further comprises flowing water vapor into the semiconductor processing chamber during the operation of forming the conformal silicon oxide liner layer.

6. The method of claim 1 wherein the method further comprises flowing water vapor into the semiconductor processing chamber during the operation of forming the silicon oxide gapfill layer.

7. The method of claim 1 wherein the second silicon-containing precursor comprises hexamethyl disilazane.

8. The method of claim 1 wherein flowing the second silicon-containing precursor comprises flowing the second silicon-containing precursor at a flow rate greater than 1 mg per minute during deposition of the conformal silicon oxide liner layer.

9. The method of claim 1 wherein the second silicon-containing precursor comprises tetramethyl disilazane.

10. The method of claim 1 comprising filling the trench with the conformal silicon oxide liner layer and the silicon oxide gapfill layer.

11. The method of claim 1 wherein a width of the trench is 40 nm or less.

12. The method of claim 1 wherein the trench comprises a silicon surface, a silicon nitride surface, and a silicon oxide surface upon which the conformal silicon oxide liner layer is formed.

13. The method of claim 1 wherein a temperature of the patterned substrate is less than 600° C. during the operation of forming the conformal silicon oxide liner layer and the operation of forming the silicon oxide gapfill layer.

14. The method of claim 1 wherein a temperature of the patterned substrate is less than 400° C. during the operation of forming the conformal silicon oxide liner layer and the operation of forming the silicon oxide gapfill layer.

15. The method of claim 1 wherein a pressure in the substrate processing region is below 700 Torr during the operation of forming the conformal silicon oxide liner layer and the operation of forming the silicon oxide gapfill layer.

16. The method of claim 1 wherein a thickness of the conformal silicon oxide liner layer is less than or about 40 nm.

17. The method of claim 1 wherein a thickness of the conformal silicon oxide liner layer is between about 5 nm and about 30 nm.

18. The method of claim 1 further comprising flowing the second silicon-containing precursor during formation of the silicon oxide gapfill layer, wherein a flow rate of the second silicon-containing precursor into the substrate processing region during formation of the silicon oxide gapfill layer is less than a flow rate of the second silicon-containing precursor during formation of the conformal silicon oxide liner layer.

19. The method of claim 1 wherein essentially no flow of the second silicon-containing precursor enters the substrate processing region during formation of the silicon oxide gapfill layer.

* * * * *